(12) United States Patent
Maeda

(10) Patent No.: US 11,469,344 B2
(45) Date of Patent: Oct. 11, 2022

(54) METHOD OF PRODUCING LIGHT-EMITTING DEVICE

(71) Applicant: NICHIA CORPORATION, Anan (JP)

(72) Inventor: Shimpei Maeda, Tokushima (JP)

(73) Assignee: NICHIA CORPORATION, Anan (JP)

( * ) Notice: Subject to any disclaimer, the term of this patent is extended or adjusted under 35 U.S.C. 154(b) by 44 days.

(21) Appl. No.: 17/161,365

(22) Filed: Jan. 28, 2021

(65) Prior Publication Data

US 2021/0242364 A1 Aug. 5, 2021

(30) Foreign Application Priority Data

Jan. 31, 2020 (JP) .............................. JP2020-015208

(51) Int. Cl.
*H01L 33/00* (2010.01)
*H01L 25/075* (2006.01)

(52) U.S. Cl.
CPC ...... *H01L 33/0093* (2020.05); *H01L 25/0753* (2013.01); *H01L 2933/0066* (2013.01)

(58) Field of Classification Search
None
See application file for complete search history.

(56) References Cited

U.S. PATENT DOCUMENTS

| | | | |
|---|---|---|---|
| 6,943,429 B1 * | 9/2005 | Glenn ................... | H01L 23/544 257/E23.179 |
| 7,067,931 B1 * | 6/2006 | Leroux ................. | G03F 9/7084 257/797 |
| 9,431,365 B2 * | 8/2016 | Seok ..................... | B23K 3/085 |
| 2002/0025616 A1 | 2/2002 | Kamigaki | |
| 2002/0131848 A1 * | 9/2002 | Kurata ................... | H01L 21/682 414/217 |
| 2002/0179812 A1 | 12/2002 | Kochi et al. | |
| 2007/0265792 A1 | 11/2007 | Gui et al. | |
| 2008/0220553 A1 * | 9/2008 | Park ..................... | G02F 1/133351 438/30 |
| 2012/0056217 A1 | 3/2012 | Jung et al. | |
| 2015/0171294 A1 * | 6/2015 | Hata ..................... | H01L 25/0753 257/98 |

(Continued)

FOREIGN PATENT DOCUMENTS

| | | |
|---|---|---|
| JP | H08153724 A | 6/1996 |
| JP | H11154694 A | 6/1999 |

(Continued)

*Primary Examiner* — Robert K Carpenter
(74) *Attorney, Agent, or Firm* — Global IP Counselors, LLP

(57) ABSTRACT

A method for producing a light-emitting device includes: bonding a plurality of light-emitting elements to a plate-shaped light transmission member all at once with the plurality of light-emitting elements being arranged in a two-dimensional array extending in a first direction and a second direction; capturing an image of the plurality of light-emitting elements bonded to the light transmission member, and forming an alignment mark on the light transmission member based on positions in the image of the plurality of light-emitting elements; and after the forming of the alignment mark, forming a contact member in contact with a corresponding one of the plurality of light-emitting elements with the contact member being positioned with respect to the plurality of light-emitting elements by using the alignment mark.

11 Claims, 8 Drawing Sheets

(56) References Cited

U.S. PATENT DOCUMENTS

| | | | | |
|---|---|---|---|---|
| 2015/0279748 A1* | 10/2015 | Spath | ............... | G01N 27/041 324/697 |
| 2015/0287625 A1* | 10/2015 | Fujimoto | ......... | H01L 21/67253 382/151 |

FOREIGN PATENT DOCUMENTS

| JP | 2000040711 A | 2/2000 |
|---|---|---|
| JP | 2002033295 A | 1/2002 |
| JP | 2002270126 A | 9/2002 |
| JP | 2003158139 A | 5/2003 |
| JP | 2006071395 A | 3/2006 |
| JP | 2006253466 A | 9/2006 |
| JP | 2007305995 A | 11/2007 |
| JP | 2012256796 A | 12/2012 |
| JP | 2012532441 A | 12/2012 |
| JP | 2013012545 A | 1/2013 |
| JP | 2015231044 A | 12/2015 |
| JP | 2018006497 A | 1/2018 |

\* cited by examiner

METHOD OF PRODUCING LIGHT-EMITTING DEVICE

CROSS-REFERENCE TO RELATED APPLICATION

This application claims priority to Japanese Patent Application No. 2020-015208, filed on Jan. 31, 2020, the disclosure of which is hereby incorporated by reference in its entirety.

BACKGROUND

The present disclosure relates to methods of producing a light-emitting device.

There is a known small-size light-emitting element chip including a phosphor plate at a light emission face thereof (see, for example, Japanese Patent Publication No. 2013-012545).

SUMMARY

The present disclosure provides a method of efficiently producing a small-size light-emitting device.

A method of producing a light-emitting device according to an embodiment of the present disclosure, includes: bonding a plurality of light-emitting elements to a plate-shaped light transmission member all at once with the plurality of light-emitting elements being arranged in a two-dimensional array extending in a first direction and a second direction; capturing an image of the plurality of light-emitting elements bonded to the light transmission member, and forming an alignment mark on the light transmission member based on positions in the image of the plurality of light-emitting elements; and after the forming of the alignment mark, forming a contact member in contact with a corresponding one of the plurality of light-emitting elements with the contact member being positioned with respect to the plurality of light-emitting elements by using the alignment mark.

A method of producing a light-emitting device according to another embodiment of the present disclosure, includes: bonding a plurality of light-emitting elements arranged in a two-dimensional array, all at once, to a plate-shaped light transmission member having an alignment mark identifying a position of a first coordinate point; capturing an image of the plurality of light-emitting elements bonded to the light transmission member, determining a position of a second coordinate point of the light transmission member based on positions in the image of the plurality of light-emitting elements, and calculating information about positional offset between the second coordinate point determined and the first coordinate point identified by the alignment mark of the light transmission member; and after the calculating of the information about the positional offset, forming a contact member in contact with a corresponding one of the plurality of light-emitting elements with the contact member being positioned with respect to the plurality of light-emitting elements by using the alignment mark of the light transmission member and the information about the positional offset.

According to the present disclosure, a small-size light-emitting device can be efficiently produced.

DETAILED DESCRIPTION

Figure 1A:
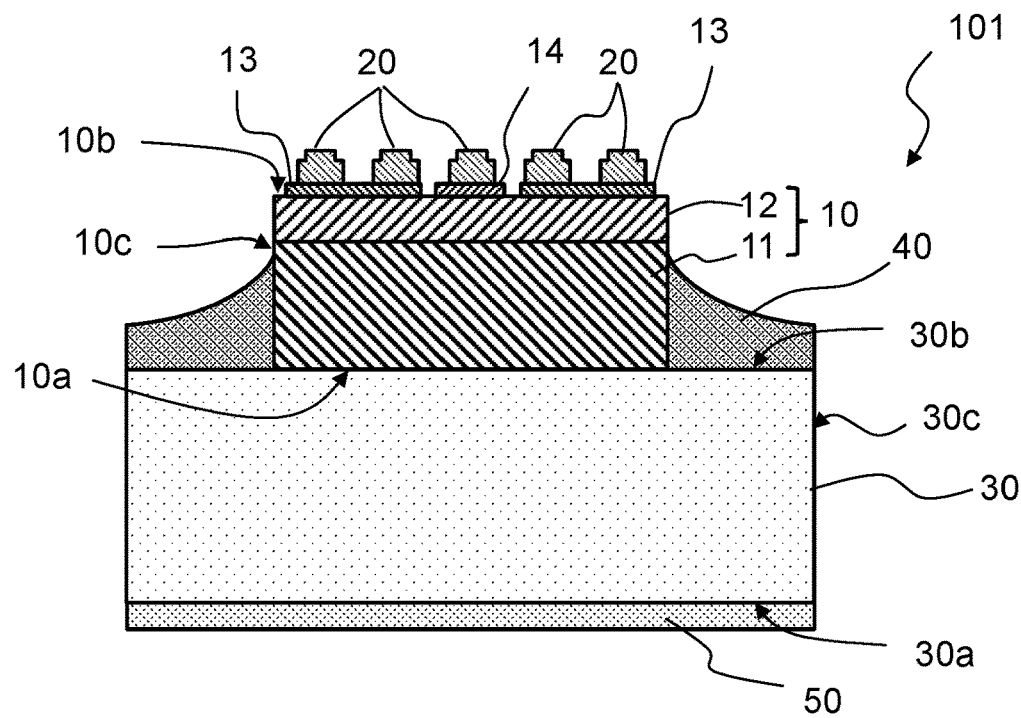
FIG. 1A is a schematic cross-sectional view of a light-emitting device according to an embodiment of the present disclosure.

Embodiments of a method of producing a semiconductor device according to the present disclosure will now be described in detail with reference to the accompanying drawings. The following embodiments are illustrative, and the method of producing a semiconductor device according to the present disclosure is not limited thereto. For example, numerical values, shapes, materials, steps, and the order of the steps, etc., indicated in the following embodiments are merely illustrative, and various modifications can be made thereto unless a technical contradiction occurs. The embodiments below are merely illustrative and can be used in various combinations unless a technical contradiction occurs.

The dimensions, shapes, etc., of elements shown in the drawings may be exaggerated for clarity. The dimensions, shapes, and space between the elements, etc., of an actual light-emitting device and light-emitting element disposed on a light transmission member are not necessarily drawn to scale, e.g., the dimensions of some parts relative to the other parts may be exaggerated. Some of the parts may not be shown, in order to avoid unnecessarily obfuscating the drawings.

In the description that follows, parts having the same or similar functions may be denoted by the same or similar reference signs and may not be described redundantly. Terms indicating specific directions and positions (e.g., "upper," "lower," "right," "left," and other terms including such terms) may be hereinafter used. Note however that these terms are only used for clarity of description to refer to relative directions and positions in the drawings to which reference is made. When applied to drawings, actual products, actual manufacturing apparatuses, etc., other than those of the present disclosure, the parts may not have the same arrangement as that shown in the drawings to which reference is made, if the parts have the same directions and positions relative to each other that are indicated by the terms such as "upper" and "lower" in the drawings to which reference is made. As used herein, the term "parallel" with respect to two straight lines, sides, planes, etc., is intended to encompass some deviations from absolute parallelism (0°) that are in the range of about ±5° unless otherwise identified. As used herein, the term "perpendicular" or "orthogonal" with respect to two straight lines, sides, planes, etc., is intended to encompass some deviations from absolute perpendicularity or orthogonality) (90°) that are in the range of about ±5° unless otherwise identified.

[Structure of Light-Emitting Device 101]

Figure 1B:
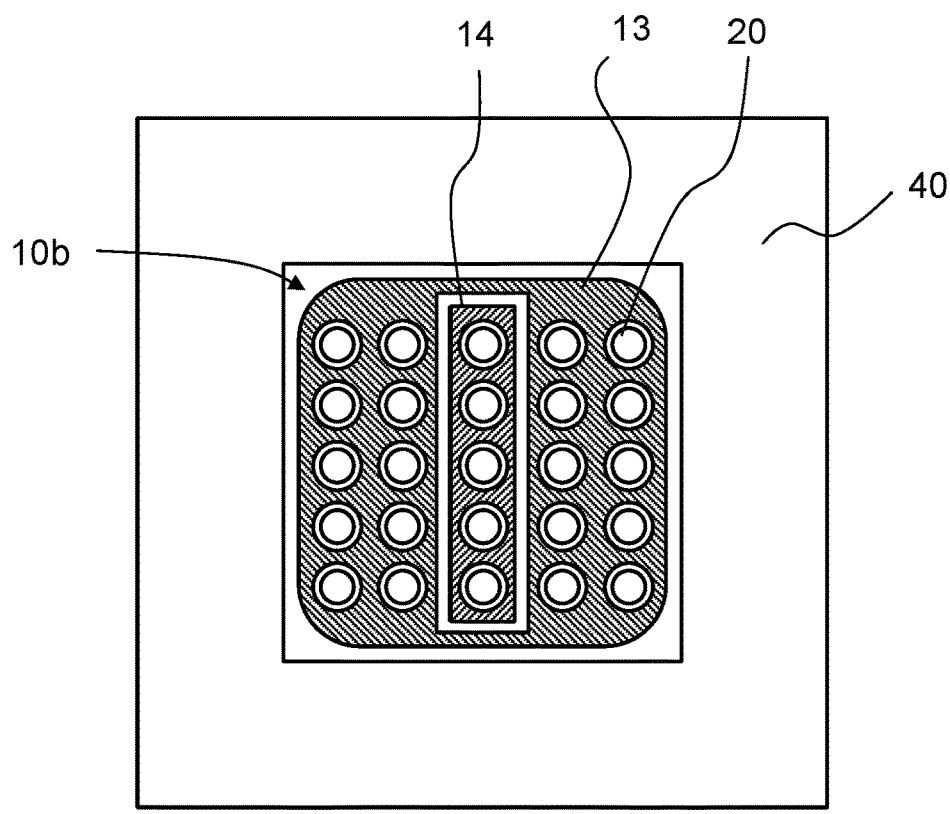
FIG. 1B is a schematic top view of the light-emitting device shown in FIG. 1A.

FIG. 1A is a schematic cross-sectional view of a light-emitting device 101 produced by the method of producing a light-emitting device according to the present disclosure. FIG. 1B is a schematic top view of the light-emitting device 101. The light-emitting device 101 includes a light-emitting element 10, bumps 20, a light transmission member 30, and a light guide member 40. The light-emitting device 101 can further include an anti-reflective film 50 on a surface of the light transmission member 30 which is a main light emission face of the light-emitting device 101. Each component will now be described in detail.

(Light-Emitting Element 10)

The light-emitting element 10 is, for example, a semiconductor light-emitting element such as a light-emitting diode. The light-emitting element 10 has a first main face 10a which is a main emission face, and a second main face 10b which is located on the opposite side from the first main face 10a, and on which an electrode is formed. When a voltage is applied to the light-emitting element 10, light is emitted mainly from the first main face 10a. The light-emitting element 10 includes a supporting substrate 11, a semiconductor multilayer structure 12, a first electrode 13, and a second electrode 14.

The supporting substrate 11 is, for example, for supporting the semiconductor multilayer structure 12, and allowing epitaxial growth. Specifically, the supporting substrate 11 is formed of sapphire, gallium nitride, or the like.

The semiconductor multilayer structure 12 is in contact with and supported by the supporting substrate 11. The semiconductor multilayer structure 12 includes a plurality of semiconductor layers. Each semiconductor layer is an epitaxial layer of various semiconductor materials such as group III-V compound semiconductors and group II-VI compound semiconductors. Specifically, each semiconductor layer is formed of a nitride-based semiconductor material which is $In_xAl_yGa_{1-x-y}N$ ($0 \leq X$, $0 \leq Y$, and $X+Y \leq 1$) or the like, e.g., a semiconductor material such as InN, AlN, GaN, InGaN, AlGaN, or InGaAlN.

The semiconductor multilayer structure 12 includes a first conductivity type first semiconductor layer (e.g., an n-type semiconductor layer), a second conductivity type second semiconductor layer (e.g., a p-type semiconductor layer), and an active layer sandwiched by the first and second semiconductor layers. Each semiconductor layer of the semiconductor multilayer structure 12 can have a thickness, impurity concentration, and the like similar to those of semiconductor layers used in the semiconductor multilayer structure of a known light-emitting element.

The first electrode 13 and the second electrode 14 are located on the second main face 10b, and are electrically coupled to the first semiconductor layer and the second semiconductor layer, respectively.

The first electrode 13 and the second electrode 14 can, for example, be formed of a monolayer film or multilayer film of a metal(s) such as Au, Pt, Pd, Rh, Ni, W, Mo, Cr, Ti, Al, or Cu, or an alloy(s) thereof. Specifically, these electrodes can be formed of a multilayer film of Ti/Rh/Au, Ti/Pt/Au, W/Pt/Au, Rh/Pt/Au, Ni/Pt/Au, Al—Cu alloy/Ti/Pt/Au, Ti/Al—Si—Cu alloy/Ti/Pt/Au, or Ti/Rh, the metals or alloys in the multilayer film being formed in the stated order with the leftmost metal or alloy closest to the semiconductor multilayer structure 12. These films have a thickness similar to that of an electrode used in a known light-emitting element.

As shown in FIG. 1B, in this embodiment, the first electrode 13 surrounds the second electrode(s) 14 at the second main face 10b. The shapes, locations, sizes, number and the like of the first electrode 13 and the second electrode 14 are not limited to those illustrated in FIG. 1B or the like. The first electrode 13 and the second electrode 14 can have other shapes.

(Bumps 20)

The bumps 20 are a contact member that is in contact with the light-emitting element 10. At least one bump 20 is disposed on each of the first electrode 13 and the second electrode 14. The bumps 20 electrically couple the first electrode 13 and the second electrode 14 of the light-emitting element 10 with a conductive area such as interconnects of a mounting substrate on which the light-emitting device 101 is mounted, and also serve as a path that allows heat generated in the light-emitting element 10 to escape to the mounting substrate. The bumps 20 are suitably used in flip-chip bonding between the light-emitting device 101 and the mounting substrate.

The bumps 20 can have a shape similar to that of a known bump used in a semiconductor device. In this embodiment, the bumps 20 are a stud bump that has a base portion, and a small protrusion located on the base portion and having a bottom face smaller than the base portion. The bumps 20 can, for example, be formed of gold, silver, copper, tin, platinum, zinc, nickel, aluminum, or an alloy thereof.

The light-emitting device 101 can be bonded to the mounting substrate by a technique such as pressure welding, hot pressure welding, ultrasonic welding, or reflow soldering. The bumps 20 have a material and shape that are suitable for these bonding techniques.

(Light Transmission Member 30)

The light transmission member 30 is in contact with the first main face 10a of the light-emitting element 10, and allows light emitted by the light-emitting element 10 to pass therethrough, so that the light is emitted to the outside. The light transmission member 30 has a first face 30a, a second face 30b located on the opposite side from the first face 30a, and a lateral face 30c located between the first face 30a and the second face 30b. The first face 30a serves as a main light emission face of the light-emitting device 101 from which light emitted from the light-emitting element 10 exits. The second face 30b is bonded to the first main face 10a of the light-emitting element 10.

The light transmission member 30 has an area larger than that of the light-emitting element 10 as viewed from above. Specifically, the first face 30a and the second face 30b are larger than the first main face 10a of the light-emitting element 10. Therefore, the second face 30b has a region that is not in contact with the first main face 10a of the light-emitting element 10, i.e., is not covered by the light-emitting element 10. The light transmission member 30 has a thickness (i.e., a height from the first face 30a to the second face 30b) of, for example, 50 µm to 300 µm.

The light transmission member 30 can, for example, be provided by processing a light-transmission material such as a resin, glass, or ceramic into a plate shape, and optionally adding a wavelength conversion substance to the plate-shaped light-transmission material, or by processing a sintered compact of a wavelength conversion substance into a plate shape. Examples of the wavelength conversion substance include oxide wavelength conversion substances, sulfide wavelength conversion substances, and nitride wavelength conversion substances. Specifically, in the case in which a gallium nitride light-emitting element which emits blue light is used as the light-emitting element 10, wavelength conversion substances such as YAG and LAG, which absorb blue light to emit yellow-green light, SiAlON (β-SiAlON) and SGS wavelength conversion substances, which emit green light, SCASN wavelength conversion substances, CASN wavelength conversion substances, potassium fluorosilicate wavelength conversion substances activated by manganese (KSF wavelength conversion substances; $K_2SiF_6$:Mn), and sulfide wavelength conversion substances, which emit red light, can be used alone or in combination. The light transmission member 30 can contain, in addition to the wavelength conversion substance, various fillers such as light-diffusion materials, for example.

The light transmission member 30 is directly bonded to the light-emitting element 10. As used herein, the term "directly bond" with respect to two elements means that the two elements are bonded by the interaction of atoms at an interface therebetween, without using a bonding material such as an adhesive. In this embodiment, the first main face 10a of the light-emitting element 10 is directly bonded to the second face 30b of the light transmission member 30.

Because the light transmission member 30 and the light-emitting element 10 are directly bonded together, heat can be efficiently transferred through the interface between the light-emitting element 10 and the light transmission member 30. Therefore, heat generated in the light-emitting element 10 can be efficiently transferred to the light transmission member 30, from which the heat can be dissipated. In particular, in the case in which the light transmission member 30 contains a wavelength conversion substance, heat generated by the wavelength conversion substance can be transferred to the mounting substrate through the light-emitting element 10. As a result, degradation due to heat generated by the light-emitting element 10 or the wavelength conversion substance of the light transmission member 30 can be reduced, resulting in an improvement in the reliability of the light-emitting device 101. In addition, the light transmission member 30 and the light-emitting element 10 are directly bonded together without through another member such as an adhesive, and therefore, the light extraction efficiency of the light-emitting device 101 can be improved.

(Light Guide Member 40)

The light guide member 40 is a contact member that is in contact with the light-emitting element 10. The light guide member 40 covers at least a portion of each of all lateral faces 10c of the light-emitting element 10. The light guide member 40 also covers a portion of the second face 30b of the light transmission member 30 that is not covered by the light-emitting element 10. The light guide member 40 reflects light emitted from the lateral faces 10c of the light-emitting element 10 at an outer face of the light guide member 40, and guides the reflected light to the light transmission member 30.

The light guide member 40 is preferably formed of a resin material in terms of easy handling and processing. The resin material can contain a resin or hybrid resin including one or more of silicone resins, modified-silicone resins, epoxy resins, modified-epoxy resins, acrylic resins, and fluoropolymers. As described below, the light guide member 40 can be formed by utilizing the viscosity of the resin material and/or wettability of the light-emitting element 10 by the resin material to form the light guide member 40.

(Anti-reflective Film 50)

The light-emitting device 101 can further include an anti-reflective film 50 disposed on the first face 30a of the light transmission member 30. The anti-reflective film 50 substantially suppresses light emitted by the light-emitting element 10 from being reflected at the first face 30a of the light transmission member 30 and then traveling back to the light-emitting element 10. As a result, the emission efficiency of light from the light-emitting element 10 can be improved. The anti-reflective film 50 can be a monolayer or multilayer film including a light-transmission film of $SiO_2$, $ZrO_2$, or the like.

[Method of producing Light-Emitting Device 101]

Figure 2:
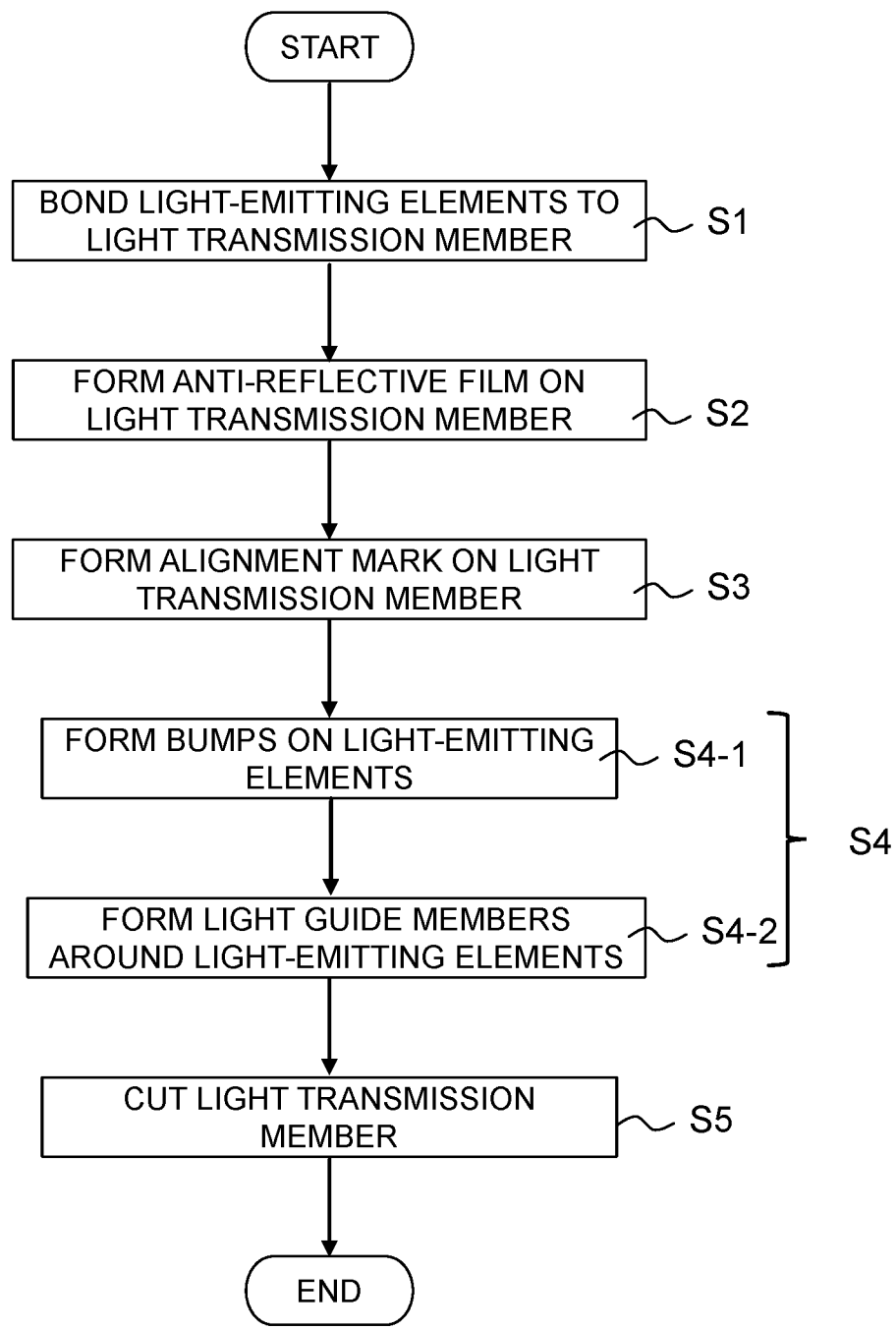
FIG. 2 is a flowchart showing a method of producing the light-emitting device shown in FIG. 1A.

An embodiment of a method of producing the light-emitting device 101 will be described. FIG. 2 is a flowchart showing an example embodiment of the method of producing the light-emitting device 101. FIGS. 3A-3G are cross-sectional views of steps in the method of producing the light-emitting device 101. The method of producing the light-emitting device 101 includes a step (S1) of bonding light-emitting elements to a light transmission member, a step (S3) of forming an alignment mark on the light transmission member, at least one step (S4) in a step of forming a contact member on the light-emitting elements, and a step (S5) of cutting the light transmission member. The method of production can further include a step (S2) of forming an anti-reflective film on the light transmission member after the step of bonding the light-emitting elements to the light transmission member, before the step (S3) of forming an alignment mark, or before the at least one step (S4) in a step of forming a contact member on the light-emitting elements. Each step will now be described in detail.

(1) Step (S1) of Bonding Light-Emitting Elements to Light Transmission Member

Figure 3A:
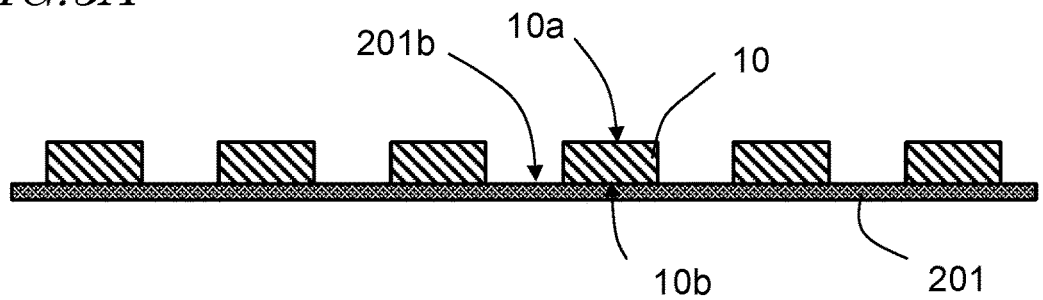
FIG. 3A is a cross-sectional view of a step in an embodiment of the method of producing the light-emitting device.
Figure 3B:
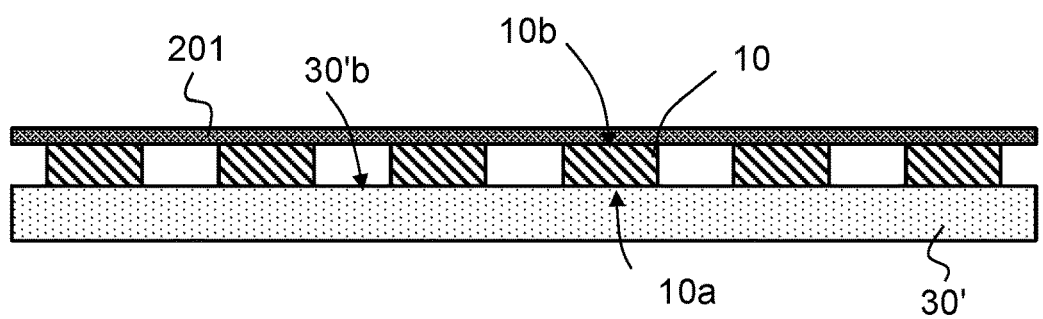
FIG. 3B is a cross-sectional view of a step in the embodiment of the method of producing the light-emitting device.

A plurality of light-emitting elements arranged in a two-dimensional array extending in a first direction and a second direction are bonded all at once to a plate-shaped light transmission member. This step further includes a step (S1-1) of disposing the plurality of light-emitting elements 10 on a support member 201 as shown in FIG. 3A, and a step (S2-2) of bringing the plurality of light-emitting elements 10 disposed on the support member 201 into contact with a light transmission member 30' as shown in FIG. 3B.

(a) Step (S1-1) of Disposing Plurality of Light-Emitting Elements 10 on Support Member 201

The plurality of light-emitting elements 10 and the support member 201 are provided. The plurality of light-emitting elements 10 are obtained by dicing a wafer having a plurality of light-emitting element structure bodies on a supporting substrate into individual light-emitting elements using a cutting tool such as a dicing saw or laser saw. At this time, the surface roughness of a face that is to be the first main face 10a of each light-emitting element 10 is preferably reduced in a state in which the plurality of light-emitting elements 10 are present on the substrate. Specifically, the face that is to be the first main face 10a of the light-emitting element 10 is preferably planarized by mechanical polishing, chemical-mechanical polishing, or the like until the arithmetic average roughness Ra thereof is 1.0 nm or less, more preferably 0.3 nm or less.

The support member 201 can be a plate-shaped member having a flat main face. Specifically, the support member 201 can be a conductive silicon wafer. The support member 201 has an adhesive layer having adhesiveness at a main face 201*b* thereof on which the light-emitting elements are to be fixed, in order to fix the light-emitting elements to the support member 201.

Figure 4:
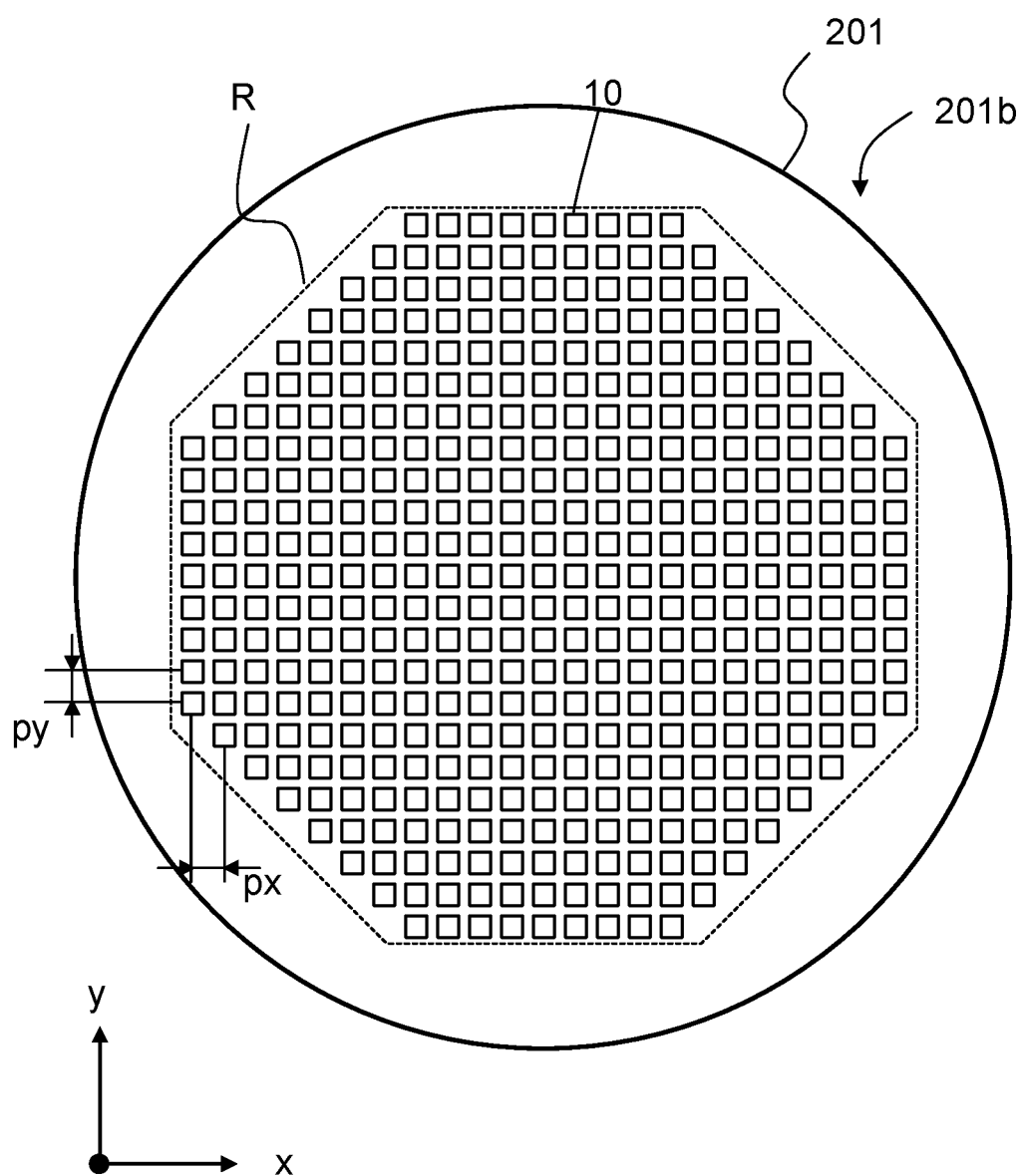
FIG. 4 is a schematic top view of light-emitting elements disposed on a support member.

The plurality of light-emitting elements 10 are arranged so that the second main face of each light-emitting element 10 faces and in contact with the main face 201*b* of the support member 201. For example, as shown in FIG. 4, on the main face 201*b* of the support member 201, the plurality of light-emitting elements 10 are arranged two-dimensionally, i.e., in an x-direction which is a first direction and a y-direction which is a second direction, at a pitch of px and py, respectively. Here, the pitch of px, py is, for example, defined as the distance between the centers of two light-emitting elements 10 adjacent to each other in the x-direction and y-direction. The pitches of px and py can be the same or different. The light-emitting elements 10 can be disposed using, for example, a chip mounter, which is used in the production of a semiconductor device. A region R where the plurality of light-emitting elements 10 are disposed can be adapted to the size and shape (described below) of the light transmission member 30'. As a result, the plurality of light-emitting elements 10 are arranged on the support member 201 in a two-dimensional array extending in the x-direction and y-direction.

(b) Step (S2-2) of Bringing Plurality of Light-Emitting Elements 10 Disposed on Support Member 201 into Contact with Light Transmission Member 30'

As shown in FIG. 3B, the plate-shaped light transmission member 30' is provided. The light transmission member 30' is preferably larger than the region R where the two-dimensional array of light-emitting elements 10 is located. The light transmission member 30' has a second face 30'*b* that preferably has a high smoothness being substantially the same as the first main face 10*a* of the light-emitting element 10. The second face 30'*b* is preferably planarized in advance by mechanical polishing, chemical-mechanical polishing, or the like until the arithmetic average roughness Ra thereof is 1.0 nm or less, more preferably 0.3 nm or less.

In this embodiment, the light transmission member 30' does not have a positioning mark such as an alignment mark. In addition, a pattern corresponding to each light-emitting element 10 is not provided on a first face 30'*a* or the second face 30'*b*.

The plurality of light-emitting elements 10 disposed on the support member 201 are brought into contact with the light transmission member 30', and are thereby bonded to the light transmission member 30'. The light-emitting elements 10 are preferably bonded to the light transmission member 30' by direct bonding technique. Specifically, the light-emitting elements 10 are preferably bonded to the light transmission member 30' by any of surface-activated bonding, hydroxy group bonding, and atomic diffusion bonding. These direct bonding techniques can be used to bond the light-emitting elements 10 and the light transmission member 30 together at a temperature close to room temperature. Therefore, an adverse influence of heat that would affect the light-emitting elements 10 and the phosphor contained in the light transmission member 30 can be reduced.

The second face 30'*b* of the light transmission member 30' and the first main face 10*a* of the light-emitting element 10 are subjected to a pretreatment suitable to the type of the direct bonding technique. For example, in the case of surface-activated bonding, the light transmission member 30' and the support member 201 supporting the plurality of light-emitting elements 10 are put into a vacuum device, in which the second face 30'*b* of the light transmission member 30' and the first main faces 10*a* of the light-emitting elements 10 are irradiated with an ion beam, plasma, or the like so that these surfaces are activated.

In the case of hydroxy group bonding, the light transmission member 30' and the support member 201 supporting the plurality of light-emitting elements 10 are subjected to wafer washing and surface hydrophilization using a chemical agent such as an acid, and pure water so that a hydroxy group is added to the second face 30'*b* of the light transmission member 30' and the first main faces 10*a* of the light-emitting elements 10, whereby these surfaces are hydrophilized.

In the case of atomic diffusion bonding, a thin metal film having about one-atomic layer thickness is formed on the second face 30'*b* of the light transmission member 30' and the first main faces 10*a* of the light-emitting elements 10 in a vacuum or inert atmosphere.

Thereafter, the pre-treated first main faces 10*a* of the light-emitting elements 10 are brought into contact with the second face 30'*b* of the light transmission member 30', and the contact is maintained for a predetermined period of time at room temperature. Optionally, the contact is maintained at a temperature that is higher than room temperature and is not higher than about 200° C., for several minutes to about one hour, for example. As a result, interatomic bond such as interatomic covalent bond is formed at a surface area of the first main face 10*a* of the light-emitting element 10 and a surface area of the second face 30'*b* of the light transmission member 30', so that, as shown in FIG. 3B, the plurality of light-emitting elements 10 are bonded all at once to the light transmission member 30'. Thereafter, the support member 201 is removed from the light-emitting elements 10.

Figure 3C:
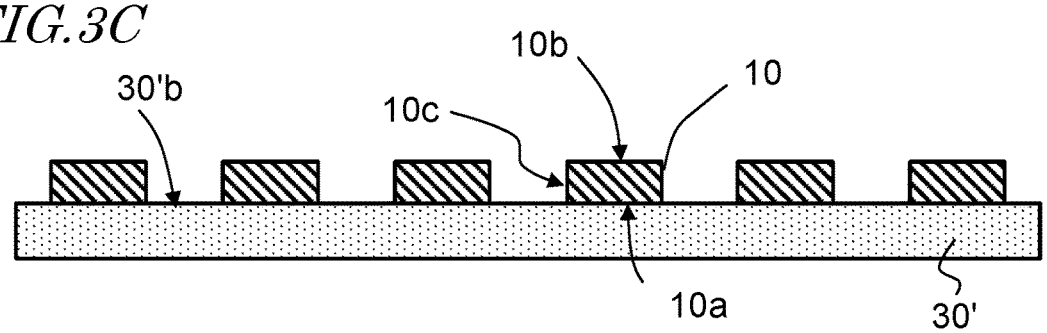
FIG. 3C is a cross-sectional view of a step in the embodiment of the method of producing the light-emitting device.
Figure 5:
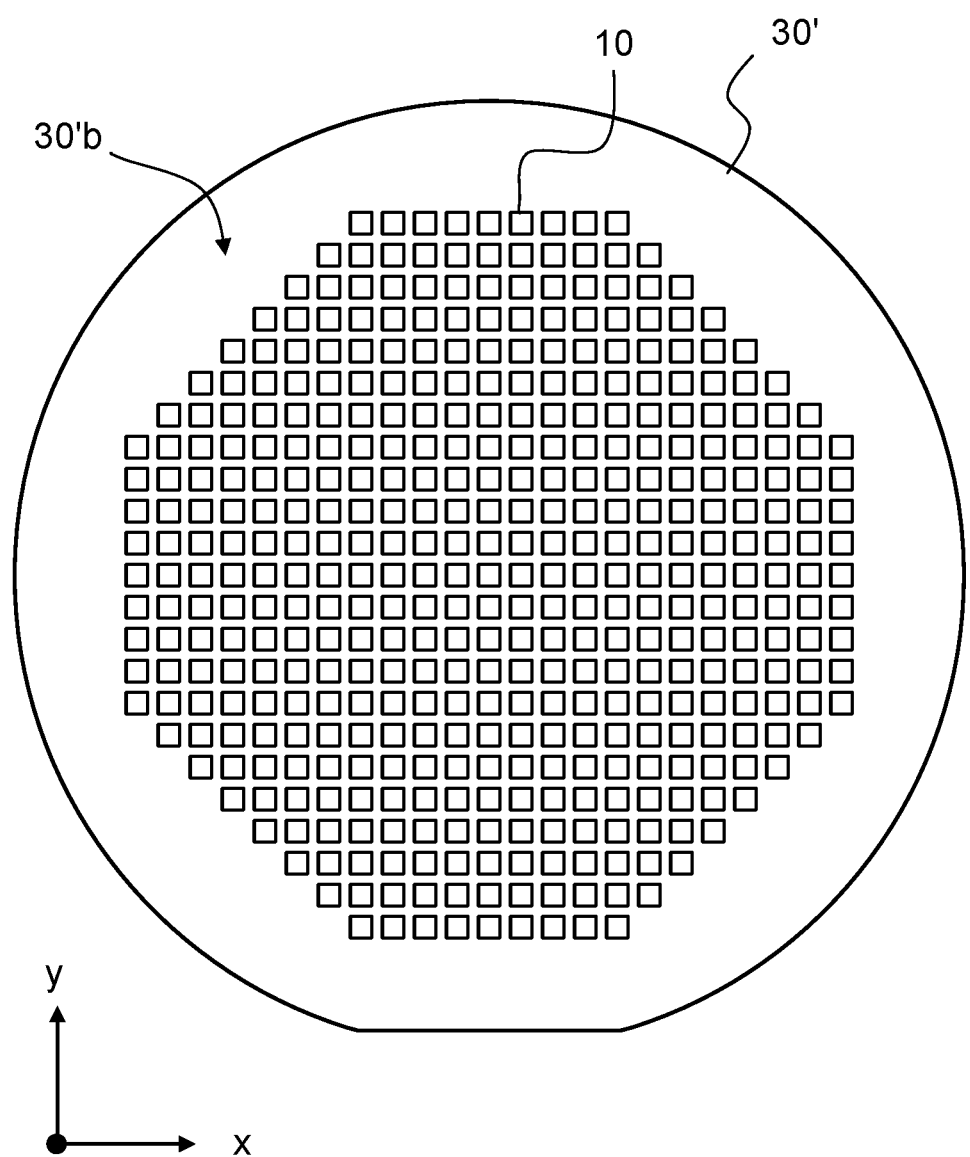
FIG. 5 is a schematic top view of a light transmission member to which light-emitting elements are bonded.

As a result, as shown in FIGS. 3C and 5, the plurality of light-emitting elements 10 arranged in a two-dimensional array extending in the x-direction and y-direction are bonded to the light transmission member 30' with the second main face 10*b* and the lateral face 10*c* exposed. In such a bonding step, it is not necessary to perform positioning of the plurality of light-emitting elements 10 with respect to the light transmission member 30' (or align the plurality of light-emitting elements 10 with the light transmission member 30' directly) when the plurality of light-emitting elements 10 are bonded to the light transmission member 30'. Therefore, even in a production process in which there are many constraints on the environment in which direct bonding is performed, such as in the chamber of a vacuum device, the plurality of light-emitting elements 10 can be quickly bonded to the light transmission member 30' without performing positioning of the plurality of light-emitting elements 10 with respect to the light transmission member 30'.

In addition, in the case in which direct bonding is used, it is not necessary to apply a bonding member to the individual light-emitting elements 10, or the like. Therefore, even in the case in which there are a large number of light-emitting elements 10 to be bonded, the time taken to bond the light-emitting elements 10 is not substantially changed, compared to the case where there are a small number of light-emitting elements 10. Therefore, a plurality of light-emitting elements 10 can be efficiently bonded to the light transmission member 30'.

(2) Step (S2) of Forming Anti-reflective Film on Light Transmission Member

Figure 3D:
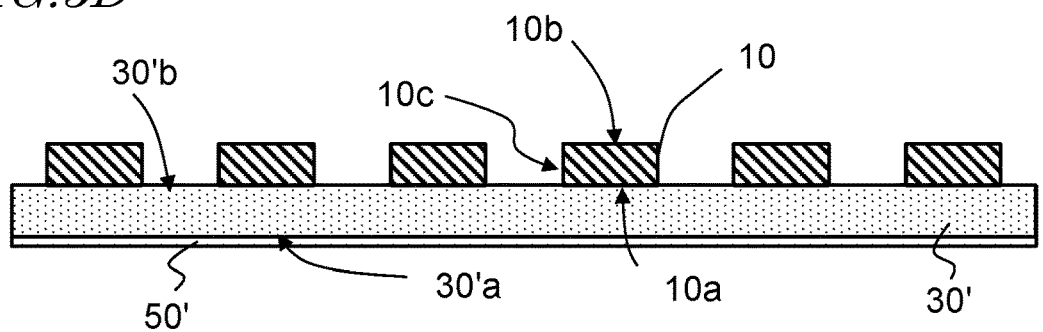
FIG. 3D is a cross-sectional view of a step in the embodiment of the method of producing the light-emitting device.

In the case in which the light-emitting device 101 includes the anti-reflective film 50, an anti-reflective film 50' can be formed on the light transmission member 30' after the step (S1) of bonding the light-emitting elements 10 to the light transmission member 30', before the step (S3) of forming an alignment mark. Alternatively, anti-reflective film 50' can be formed on the light transmission member 30' before the at least one step (S4) of forming a member on the light-emitting elements 10. As shown in FIG. 3D, the anti-reflective film 50' is formed on the first face 30'a of the light transmission member 30'. At this time, the first face 30'a of the light transmission member 30' can be polished, so that the thickness of the light transmission member 30' is adjusted. Thereafter, the anti-reflective film 50' is formed on the first face 30'a using a known thin-film formation technique.

(3) Step (S3) of Forming Alignment Mark

As described above, the plurality of light-emitting elements 10 are arranged on the light transmission member 30' in a two-dimensional array extending in the x-direction and y-direction. However, the light transmission member 30' is not provided with an alignment mark, and therefore, the position of each light-emitting element 10 on the light transmission member 30' cannot be identified from the light transmission member 30'. Therefore, in the steps performed thereafter, in the case in which one or more components are added to the light-emitting elements 10 or in the case in which the light-emitting elements 10 are processed, the position of the light-emitting elements 10 need to be individually found and identified by, for example, image recognition. However, for example, in the case in which one or more components are formed on the light-emitting elements 10 on the light transmission member 30', the finding and identification of the position by image recognition needs to be performed as many times as the number of light-emitting elements 10, resulting in time consuming.

In the method of producing a light-emitting device according to this embodiment, after the plurality of light-emitting elements 10 are bonded to the light transmission member 30', a pattern under which the plurality of light-emitting elements 10 are arranged, i.e., information about a coordinate system in which the plurality of light-emitting elements 10 are disposed, is formed as an alignment mark(s) on the light transmission member 30'. Specifically, an image of the plurality of light-emitting elements 10 bonded to the light transmission member 30' is captured, and an alignment mark is formed on the light transmission member 30' based on the positions in the image of the plurality of light-emitting elements 10. In this step, a device is used that can recognize the image of the plurality of light-emitting elements 10 disposed on the light transmission member 30', and can form a mark on the light transmission member 30' based on the result of the recognition. A semiconductor substrate cutting device such as a dicing saw or laser saw can be preferably used. A semiconductor production device having such an image recognition function can be controlled based on the result of image recognition. For example, in the abovementioned semiconductor substrate cutting device, coordinate points on a stage on which an object to be processed is held are brought into correspondence with the coordinate points identified in the image so that a semiconductor substrate can be cut at positions identified in the image.

Figure 6:
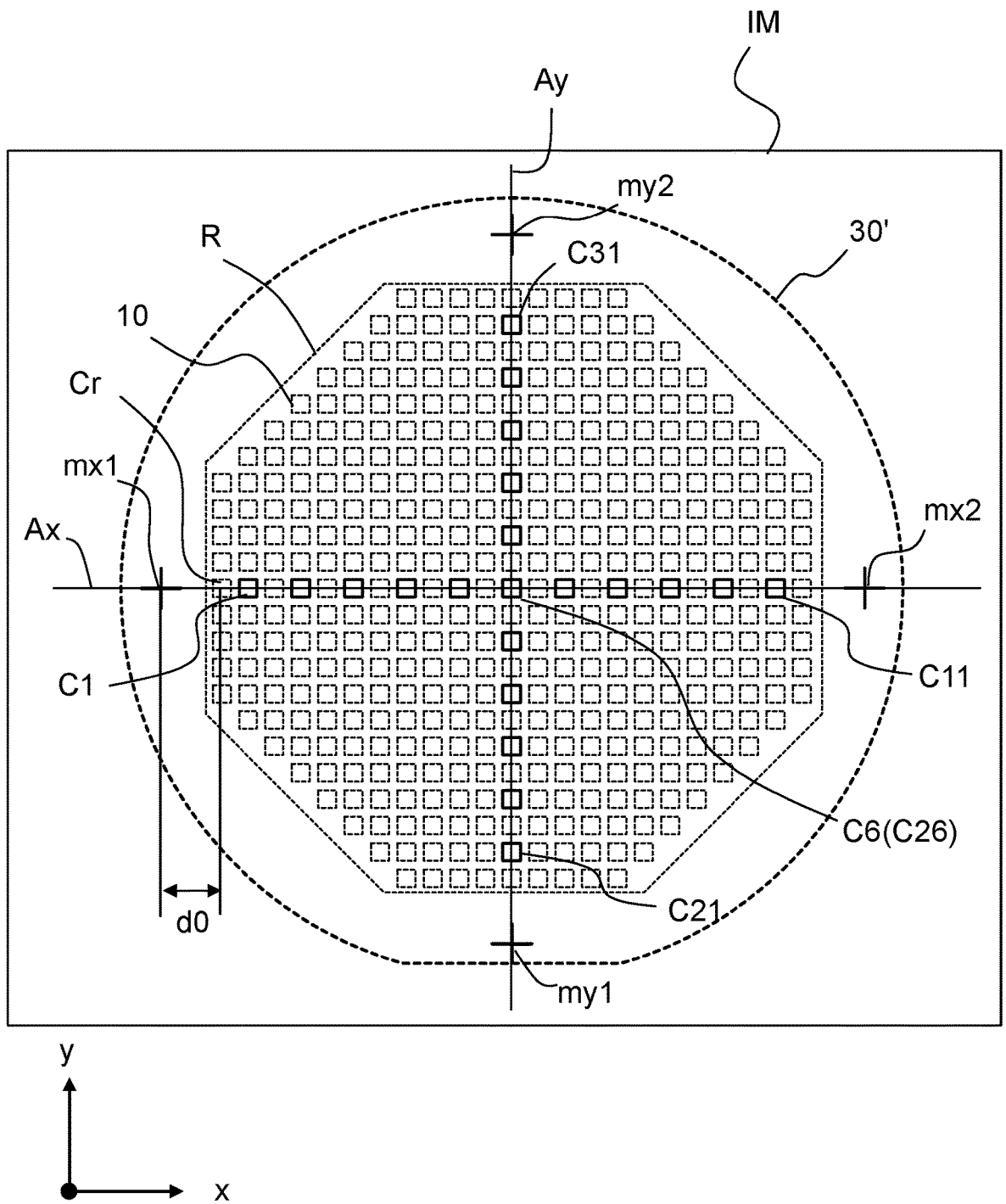
FIG. 6 is a schematic diagram for illustrating how to determine a reference position in an image captured by a cutting device.

Initially, as shown in FIG. 6, an image IM of the light-emitting elements 10 arranged in a two-dimensional array on the light transmission member 30' is captured by an imaging device such as, for example, a camera provided to a dicing saw. An image processing circuit of the dicing saw analyzes the captured image IM to detect an outer shape of each light-emitting element 10. For example, some of the light-emitting elements 10 that are aligned in a direction parallel to a first side of the four sides defining the outer shape of the light-emitting element 10 are selected. For example, C1-C11 are selected in FIG. 6. The number of light-emitting elements 10 selected is not particularly limited as long as that number is two or more. As the number of light-emitting elements 10 selected increases, the accuracy of a correlation between the position of an alignment mark formed and the coordinate points of the light-emitting element 10 arranged in a two-dimensional array can be improved. It is preferable that the distance between two of the selected light-emitting elements 10 that are located furthest away from each other is large because a tolerance may be reduced. The image processing circuit of the dicing saw can analyze the captured image two-dimensionally, e.g., can detect the x- and y-coordinate points of the position of each pixel in the image.

For example, the image processing circuit determines the coordinate points C1 (x, y)-C11 (x, y) of the centers of the light-emitting elements C1-C11 from image data, and determines a first axis Ax that is an approximate straight line, by the method of least squares or the like, using the 11 determined coordinate points of the light-emitting elements C1-C11.

Likewise, the image processing circuit of the dicing saw selects some of the light-emitting elements 10 that are arranged in a direction parallel to a second side adjacent to the first side of the four sides defining the outer shape of the light-emitting element 10. For example, C21-C31 are selected in FIG. 6. In addition, for example, the coordinate points C21 (x, y)-C31 (x, y) of the centers of the light-emitting elements C21-C31 are determined from image data, and a second axis Ay that is a straight line is determined by the method of least squares or the like using the 11 determined coordinate points of the light-emitting elements C21-C31. In this example, the light-emitting element C6 is the same as the light-emitting element C26. The plurality of light-emitting elements used to determine the first axis Ax and the second axis Ay may or may not share the same element.

The first axis Ax and the second axis Ay can be set at any position as long as the axes extend across the region R. In the case in which the first axis Ax and the second axis Ay are set so that the first axis Ax and the second axis Ay intersect at or near the center of the region R, positioning tolerances are most uniform in the region R in production of a plurality of light-emitting elements 10. Therefore, in terms of management of tolerance in production, the light-emitting elements C1-C11 and the light-emitting elements C21-C31 are preferably selected in the image IM so that the first axis Ax and the second axis Ay passing through the center of the region R can be set.

The image processing circuit of the dicing saw then determines reference positions mx1 and mx2 on the first axis Ax, and reference positions my1 and my2 on the second axis Ay. The reference positions mx1 and mx2 and the reference positions my1 and my2 can be set at appropriately determined positions on the first axis Ax or the second axis Ay in an outer peripheral region R' that is outside the region R in which the plurality of light-emitting elements 10 are arranged, and is inside the light transmission member 30'. The reference position mx1 and the reference position mx2 are preferably opposite each other with the region R in between. Likewise, the reference position my1 and the reference position my2 are preferably opposite each other with the region R in between. It is preferable that two or more reference positions is provided on each of the first axis Ax and the second axis Ay.

Any of the reference positions mx1 and mx2 and the reference positions my1 and my2 can be used as an origin or reference point. In that case, the coordinate points of the selected reference position and any light-emitting element Cr of the plurality of light-emitting elements 10 located in the region R are stored. Alternatively, the selected light-emitting element Cr is determined in advance, and then a reference position is set at a position satisfying a predetermined positional relationship (the first axis Ax and the second axis Ay) with respect to the light-emitting element Cr. For example, in the example of FIG. 6, axes passing through the center of the region R are determined as the first axis Ax and the second axis Ay, and the reference position mx1 is set at a predetermined distance of d0 from the light-emitting element Cr of the plurality of light-emitting elements 10 that is located at the furthest end on the first axis.

Figure 7:
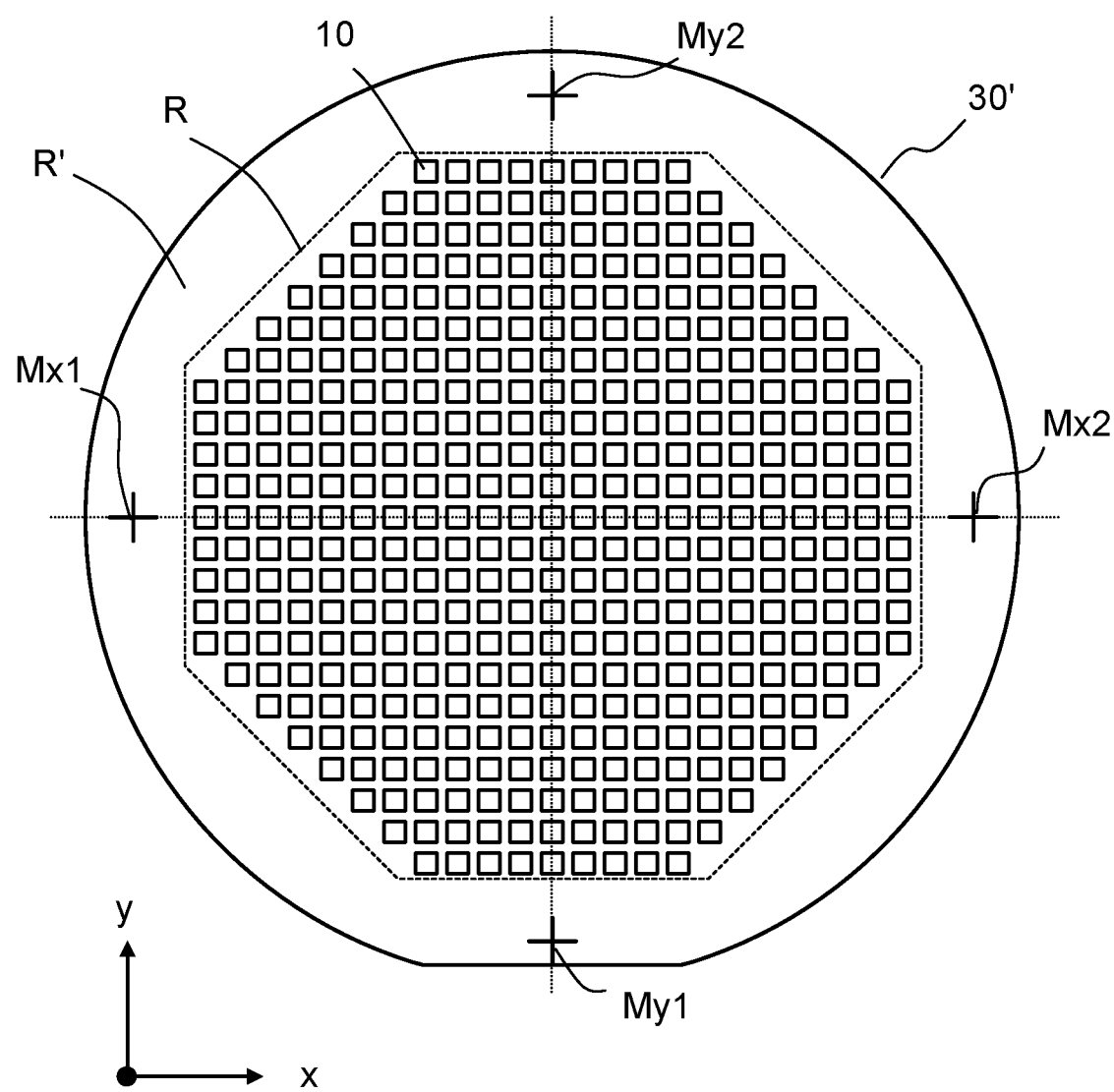
FIG. 7 is a schematic top view of a light transmission member on which alignment marks are formed.

As shown in FIG. 7, alignment marks Mx1, Mx2, My1, and My2 are formed in the outer peripheral region R' of the light transmission member 30', corresponding to the reference positions mx1 and mx2 and the reference positions my1 and my2 in the set image, using a cutting function of a device used. For example, grooves are formed as the alignment marks Mx1, Mx2, My1, and My2 on the light transmission member 30' using a rotating blade, laser, or the like. Preferably, the grooves do not penetrate through the light transmission member 30'. The shape of the alignment marks Mx1, Mx2, My1, and My2 can be appropriately determined. For example, as shown in FIG. 7, a cross-shaped groove whose center serves as a reference position can be formed as the alignment marks Mx1, Mx2, My1, and My2 on the surface of the light transmission member 30'. For example, in the case in which the alignment mark is formed using a dicing saw, the alignment mark is, for example, preferably a combination of two straight lines, more preferably a combination of two straight lines extending in the x-direction and y-direction in which the plurality of light-emitting elements are arranged. As a result, the alignment mark can be easily formed using a dicing saw. Specifically, examples of the shape of the alignment mark as viewed from above the light transmission member 30' include a cross shape, L shape, and T shape. The width and depth of the groove can be such that the resultant alignment mark can be recognized by an image recognition circuit of a semiconductor production device. For example, the width is about 10 µm to 100 µm, and the depth is about 10 µm to 100 µm.

As a result, two axes of coordinates defining a two-dimensional array of the plurality of light-emitting elements 10 disposed on the light transmission member 30' are provided to the light transmission member 30'. In other words, by detecting the positions of the alignment marks Mx1, Mx2, My1, and My2, the positions of the plurality of light-emitting elements 10 can be identified.

The two-dimensional arrangement of the plurality of light-emitting elements 10 is determined in the step (S1-1) of disposing the plurality of light-emitting elements 10 on the support member 201. In other words, the relationship between the two axes of the arrangement is known. For example, the x-axis and the y-axis are orthogonal to each other. Therefore, if any one of the alignment marks Mx1, Mx2 and the alignment marks My1, My2 can not be formed, the first axis Ax or the second axis Ay, for which a reference position corresponding to an alignment mark not formed is set, can not be determined.

(4) Step (S4) of Forming Contact Member in Contact with Light-Emitting Element

After the formation of the alignment marks Mx1, Mx2, My1, and My2, the step is performed by utilizing the alignment marks Mx1, Mx2, My1, and My2 formed. In this embodiment, a step (S4-1) of forming bumps and a step (S4-2) of forming a light guide member are performed as a step of forming a contact member that is in contact with a light-emitting element. By performing at least one step of these steps, a contact member that is in contact with a light-emitting element is formed. Examples of the contact member include a bump and a light guide member.

(a) Step (S4-1) of Forming Bumps

Figure 3E:
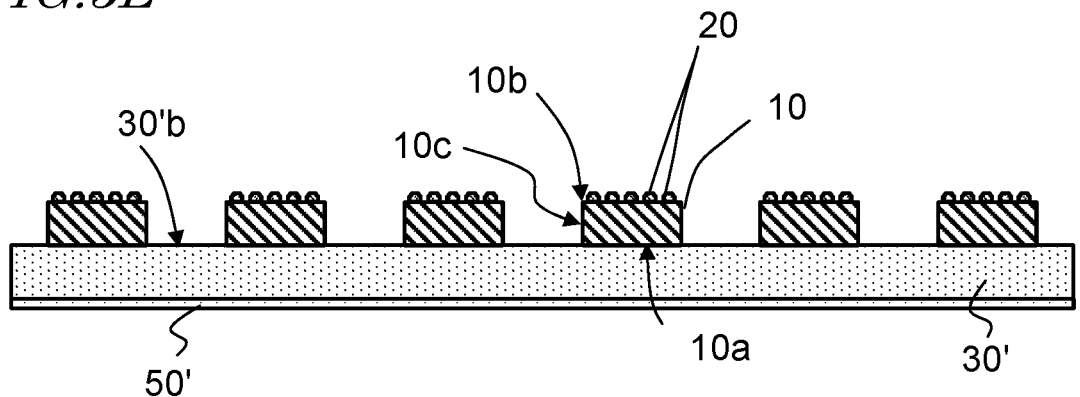
FIG. 3E is a cross-sectional view of a step in the embodiment of the method of producing the light-emitting device.

As shown in FIG. 3E, bumps 20 are formed on each light-emitting element 10. The bumps 20 can be formed using a bonding device, such as a commercially available bump bonder or wire bonder.

The light transmission member 30' to which the light-emitting elements 10 are bonded is placed on a stage of the bonding device, and an image of the light transmission member 30' is captured. An image processing circuit of the bonding device detects the alignment marks Mx1, Mx2, My1, and My2 in the image. As a result, two directions in the two dimensions of the light-emitting elements 10 arranged on the light transmission member 30' are identified. For example, the bonding device turns the stage so that two directions (the x-axis and the y-axis) as a reference for control coincide with a straight line passing through the alignment marks Mx1 and Mx2 and a straight line passing through the alignment marks My1 and My2. As a result, for example, two axes serving as a reference for a drive direction of a capillary for discharging a molten metal which is to form a wire coincide with the two axes of the array of the light-emitting elements 10. In the case in which one of the alignment marks Mx1, Mx2, My1, and My2 also serves as an origin or reference point as described above, the positions of the light-emitting elements 10 disposed on the light transmission member 30' are identified.

In the case in which none of the alignment marks Mx1, Mx2, My1, and My2 serves as an origin or reference point, the position of one of the plurality of light-emitting elements 10 is identified by image recognition. As a result, by using the identified position of that light-emitting element 10 as a reference, the positions of all the light-emitting elements 10 on the light transmission member 30' are identified. This allows the bonding device to form the bumps 20 on the first electrode 13 and the second electrode 14 located on the second main face 10b of each light-emitting element 10 without performing image recognition to identify the position of each light-emitting element 10.

Specifically, the bonding device melts an end of a metal wire coming out from a capillary of a stud bump bonder to form a ball, solidifies and fixes the formed ball to the first electrode 13 and the second electrode 14 located on the second main face 10b of the light-emitting element 10 by ultrasonic thermocompression bonding or the like, and cuts and separates the solidified and fixed ball from the metal wire. As a result, the bumps 20 are formed on the first electrode 13 and the second electrode 14 of the light-emitting element 10. The cutting and separation of the ball is preferably carried out by raising the capillary while holding the metal wire after the ball is solidified and fixed to the first electrode 13 or the second electrode 14, and then horizontally moving the capillary to cut the deformed ball at an edge of the capillary by rubbing so that an upper end of the metal wire is relatively flat.

The shape of the bump 20 formed can be suitably adjusted by the amount of the metal wire melted, the shape of the end of the capillary, the magnitude of pressure, and the like. The height of the bump 20 can be suitably adjusted by the height by which the capillary is raised, the timing of the horizontal movement of the capillary, and the like. An upper end of the bump 20 can be subjected to planarization such as etching, blasting, polishing, or the like. Alternatively, a voltage can be applied to the bump 20 formed so that a spark occurs, whereby an upper end of the bump 20 can be melted and recrystallized to be softened or smoothed.

Such a technique is used to form the bump 20 that has a projecting end portion on the light-emitting element 10. In addition, if an upper end of the bump 20 is softened, the upper end is easily deformed during flip-chip bonding so that the upper end can easily adhere to wiring on a mounting substrate, and therefore, high-strength bonding can be achieved even at room temperature.

An interval between each bump 20 can be suitably set, depending on the size of the light-emitting element 10, the number of bumps 20 formed, and the like. For example, the larger contact area between the bump 20 and the light-emitting element 10 is more preferable in terms of heat dissipation properties, and therefore, the shorter distance between each bump 20 formed on the same electrode is more preferable. In addition, when the light-emitting device is mounted on a mounting substrate, a light reflective resin can be provided between each bump 20 in order to reduce light absorption by the mounting substrate. In that case, taking into account the flowability of the resin material, the distance between each bump 20 is preferably great enough not to reduce the flowability of the resin material. Given these points, the distance between each bump 20 is, for example, about 10 μm to 45 μm. In this embodiment, as described above, the bumps 20 are formed on the light-emitting element 10, and therefore, positioning of the bumps 20 can be performed with respect to the light-emitting element 10 with high precision. Therefore, the distance between each bump 20 can be reduced with the bumps 20 separated from each other to a suitable extent.

When bumps 20 are formed on the next light-emitting element 10, the bonding device identifies the position of an adjacent light-emitting element 10 using the pitches of px and py used in the step (S1-1) of disposing the light-emitting elements 10 on the support member 201, without the necessity of identifying the next light-emitting element 10 by image recognition. Therefore, compared to the case where the positions of the light-emitting elements 10 are identified by performing image recognition for each light-emitting element 10, the time taken to form the bumps 20 on all the light-emitting elements 10 can be reduced.

(b) Step (S4-2) of Forming Light Guide Members 40'

Figure 3F:
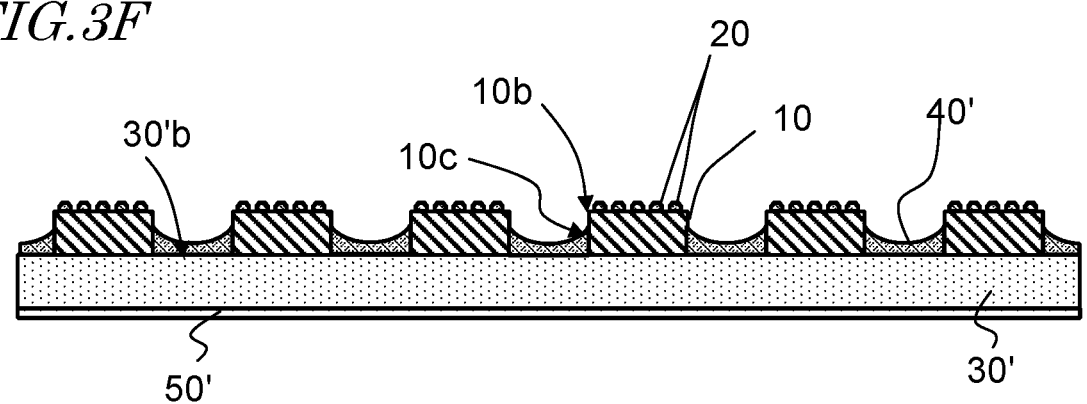
FIG. 3F is a cross-sectional view of a step in the embodiment of the method of producing the light-emitting device.

After the step of forming the bumps 20, and before the step of cutting the light transmission member 30' into pieces, the lateral faces 10c of each of the plurality of light-emitting elements 10 are covered by a light guide member 40' as shown in FIG. 3F. The light guide members 40' can be formed by disposing and curing an uncured light guide member 40' on the light transmission member 30' around the light-emitting elements 10. For the uncured light guide member 40', a liquid discharge device such as a dispenser or potting device that can discharge a liquid to a predetermined position can be used.

The light transmission member 30' to which the light-emitting elements 10 are bonded is placed on a stage of the liquid discharge device, and an image of the light transmission member 30' is captured. An image processing circuit of the liquid discharge device detects the alignment marks Mx1, Mx2, My1, and My2 in the image, and for example, the liquid discharge device turns the stage so that two directions (the x-axis and the y-axis) as a reference for control in the liquid discharge device coincide with a straight line passing through the alignment marks Mx1 and Mx2 and a straight line passing through the alignment marks My1 and My2. As described above, the positions of all the light-emitting elements 10 on the light transmission member 30' are identified by using one of the alignment marks Mx1, Mx2, My1, and My2 as an origin or reference point, or by identifying the position of one of the plurality of light-emitting elements 10 by image recognition.

The uncured light guide member 40' discharged from a nozzle is disposed around each light-emitting element 10. The discharge device determines a position where the uncured light guide member 40' is to be discharged, by utilizing information about the above identified positions of the light-emitting elements 10. Thereafter, the uncured light guide member 40' is cured by giving energy such as heat or UV light thereto. As a result, the light guide members 40' covering the lateral faces 10c of the light-emitting elements 10 are disposed.

By utilizing the alignment marks Mx1, Mx2, My1, and My2 of the light transmission member 30', the light guide members 40' can be formed without performing image recognition for each light-emitting element 10 to identify the positions of the light-emitting elements 10. Therefore, the time taken to form the light guide member 40' for all the light-emitting elements 10 can be reduced.

(5) Step (S5) of Cutting Light Transmission Member

Figure 3G:
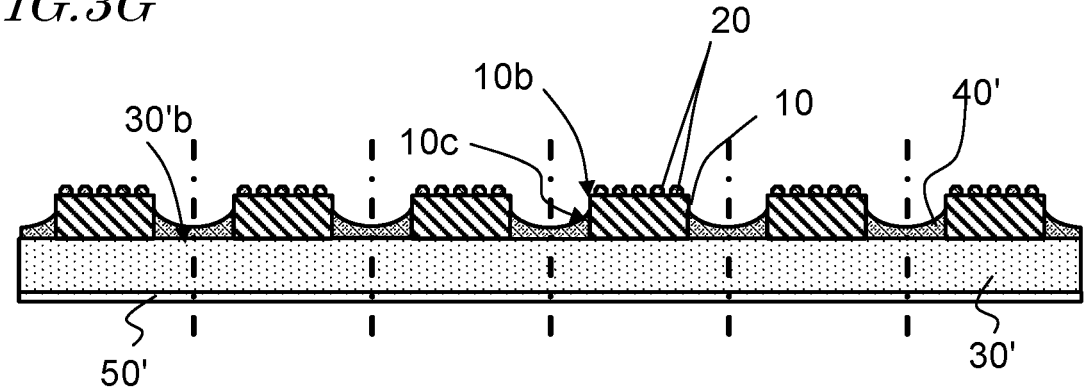
FIG. 3G is a cross-sectional view of a step in the embodiment of the method of producing the light-emitting device.

Subsequently, the step (S5) of cutting the light transmission member is performed by utilizing the alignment marks Mx1, Mx2, My1, and My2. As shown in FIG. 3G, the light transmission member 30' supporting the light-emitting elements 10 to which the bumps 20 and the light guide members 40' are provided is cut, for example, for each light-emitting element 10, as shown in dash-dot lines. At this time, at the same time, the light guide member 40' is also cut. The cutting is carried out using a cutting device, such as a dicing saw or laser saw.

As in the formation of the bumps 20 and the formation of the light guide members 40', the light transmission member 30' to which the light-emitting elements 10 are bonded is placed on a stage of the cutting device, and an image of the light transmission member 30' is captured. An image processing circuit of the cutting device detects the alignment marks Mx1, Mx2, My1, and My2 in the image, and for example, the cutting device turns the stage so that two directions (the x-axis and the y-axis) used as a reference for control in the cutting device coincide with a straight line passing through the alignment marks Mx1 and Mx2 and a straight line passing through the alignment marks My1 and My2. As described above, the positions of all the light-emitting elements 10 on the light transmission member 30' are identified by using one of the alignment marks Mx1, Mx2, My1, and My2 as an origin or reference point, or by identifying one of the plurality of light-emitting elements 10 by image recognition. Therefore, with the image processing circuit of the cutting device, the light transmission member 30' can be cut by utilizing information about the positions of the light-emitting elements 10 on the light transmission member 30'. By the cutting, the light-emitting device 101 shown in FIG. 1A is obtained.

By utilizing the alignment marks Mx1, Mx2, My1, and My2 of the light transmission member 30', the light guide members 40' and the light transmission member 30' can be cut without performing image recognition for each light-emitting element 10 to identify the positions of the light-emitting elements 10. Therefore, the time taken to separate the individual light-emitting elements 10 from each other can be significantly reduced.

In this embodiment, the light transmission member 30' is cut such that each piece includes a single light-emitting element 10. Alternatively, the light transmission member 30' can be cut such that at least one piece includes a plurality of light-emitting elements 10.

Thus, in the method of producing a light-emitting device according to this embodiment, the steps of forming the bumps 20 and the light guide member 40 of each light-emitting element 10 and the step of cutting the light transmission member 30' are performed using the alignment marks formed on the light transmission member 30'. Therefore, compared to the case in which the position of each light-emitting element 10 is identified by image recognition, the time taken to perform these steps can be reduced. In other words, in the method of producing a light-emitting device according to this embodiment, the light-emitting device can be efficiently produced, particularly in terms of the time taken to produce the light-emitting device.

[Other Embodiments]

In the above embodiments, an alignment mark is utilized in each of the step of forming the bumps 20, the step of forming the light guide members 40, and the step of cutting the light transmission member 30'. Alternatively, by utilizing an alignment mark in at least one of these steps, the time taken to produce a light-emitting device can be reduced.

In the above embodiments, the alignment marks Mx1, Mx2, My1, and My2 are formed by grooves separated from each other. Alternatively, the alignment mark can be a mark that can be recognized by an image recognition circuit of a semiconductor production device, such as another structure that can be optically recognized. Specifically, the alignment mark can be one that causes a difference in refractive index or a difference in reflectance. For example, a metal thin film can be formed in the outer peripheral region R' of the second face 30'b of the light transmission member 30', and the alignment mark can be formed by removing a portion of the metal thin film. Alternatively, conversely, the alignment mark itself can be formed of a metal thin film. A portion of an alignment mark can be connected to a portion of another alignment mark. For example, in the case in which alignment marks are formed by a groove, a single groove can be continuous between two alignment marks. Even in that case, if the two alignment marks linked by the groove can be identified by two different coordinate points, the two alignment marks are distinctive.

In the above embodiments, before the light-emitting elements 10 are bonded to the light transmission member 30', an alignment mark is not formed on the light transmission member 30'. However, before the light-emitting elements 10 are bonded to the light transmission member 30', an alignment mark can be formed on the light transmission member 30'. For example, an alignment mark that identifies the position of a first coordinate point can be provided on the light transmission member 30' in advance.

In that case, in the step (S3) of forming an alignment mark in the above method of producing a light-emitting device, an image of the plurality of light-emitting elements 10 bonded to the light transmission member 30' is captured, and an x-axis and a y-axis (i.e., the position of a second coordinate point of the two-dimensional array of the light-emitting elements 10 bonded to the light transmission member 30') are determined based on the positions in the image of the plurality of light-emitting elements 10. Then, information about a positional offset between the position of the second coordinate point determined and the first coordinate point identified by the alignment mark on the light transmission member 30' is calculated.

The step of forming the bumps 20, the step of forming the light guide members 40, and the step of cutting the light transmission member 30' can each be carried out using the alignment mark of the light transmission member 30' and the information about the positional offset between the first and second coordinate points.

The method of producing a light-emitting device according to the present disclosure can be suitably used in the production of a light-emitting device used in various applications, and more particularly, can be suitably used in the production of a chip-scale light-emitting device.

While exemplary embodiments of the present disclosure have been described, it is understood that the words that have been used are words of description and illustration, rather than words of limitation. The present disclosure may be modified in numerous ways and may assume many embodiments other than those specifically described above. Accordingly, the appended claims are intended to cover all modifications, enhancements, and other embodiments of the present disclosure that fall within the spirit and scope of the invention.

What is claimed is:

1. A method for producing a light-emitting device, comprising:
    bonding a plurality of light-emitting elements to a plate-shaped light transmission member all at once with the plurality of light-emitting elements being arranged in a two-dimensional array extending in a first direction and a second direction;
    capturing an image of the plurality of light-emitting elements bonded to the light transmission member, and forming an alignment mark on the light transmission member based on positions in the image of the plurality of light-emitting elements; and
    after the forming of the alignment mark, forming a contact member in contact with a corresponding one of the plurality of light-emitting elements with the contact member being positioned with respect to the plurality of light-emitting elements by using the alignment mark.

2. The method according to claim 1, wherein
    the forming of the contact member includes at least one of:
    forming a bump as the contact member on a face of each of the plurality of light-emitting elements opposite to a face of each of the light-emitting elements to which the light transmission member is bonded; and
    forming a light guide member as the contact member on the light transmission member so as to cover a lateral face of each of the plurality of light-emitting element.

3. The method according to claim 2, further comprising
    after the forming the contact member, cutting the light transmission member into a plurality of pieces by using the alignment mark such that at least one of the light-emitting elements is included in each of the plurality of pieces, to obtain a plurality of light-emitting devices.

4. The method according to claim 1, wherein
    the bonding of the plurality of light-emitting elements to the light transmission member further includes:
    disposing the plurality of light-emitting elements in the two-dimensional array on a support member; and
    bringing the plurality of light-emitting elements disposed on the support member into contact with the light transmission member.

5. The method according to claim 1, wherein
the light transmission member contains a wavelength conversion substance.

6. The method according to claim 1, wherein
the forming of the alignment mark includes forming the alignment mark on outside of a bonding region of the light transmission member in which the plurality of light-emitting elements are bonded.

7. The method according to claim 1, wherein
the forming of the alignment mark includes forming a groove as the alignment mark on a face of the light transmission member to which the light-emitting elements are bonded.

8. The method according to claim 7, wherein
the forming of the alignment mark includes forming the groove using a dicing saw.

9. The method according to claim 1, wherein
the forming of the alignment mark includes:
  determining, in the image, a first approximation straight line passing through two or more of the plurality of light-emitting elements aligned in the first direction, and a second approximation straight line passing through two or more of the plurality of light-emitting elements aligned in the second direction;
  determining, in the image, a first axis parallel to the first approximation straight line, a second axis parallel to the second approximation straight line, and reference positions located on the first axis and the second axis; and
  forming the alignment mark on the light transmission member based on the reference positions in the image.

10. The method according to claim 1, wherein
the bonding of the plurality of light-emitting elements to the light transmission member includes bonding the plurality of the light emitting elements to the light transmission member having no alignment mark.

11. A method for producing a light-emitting device, comprising:
  bonding a plurality of light-emitting elements arranged in a two-dimensional array, all at once, to a plate-shaped light transmission member having an alignment mark identifying a position of a first coordinate point;
  capturing an image of the plurality of light-emitting elements bonded to the light transmission member, determining a position of a second coordinate point of the light transmission member based on positions in the image of the plurality of light-emitting elements, and calculating information about positional offset between the second coordinate point determined and the first coordinate point identified by the alignment mark of the light transmission member; and
  after the calculating of the information about the positional offset, forming a contact member in contact with a corresponding one of the plurality of light-emitting elements with the contact member being positioned with respect to the plurality of light-emitting elements by using the alignment mark of the light transmission member and the information about the positional offset.

* * * * *